US006584201B1

(12) United States Patent
Konstantinou et al.

(10) Patent No.: US 6,584,201 B1
(45) Date of Patent: Jun. 24, 2003

(54) REMOTE AUTOMATIC VOLUME CONTROL APPARATUS

(75) Inventors: Kyriaki Konstantinou, Morristown, NJ (US); Ajay Rajkumar, New Providence, NJ (US); Anthony A. Triolo, Succasunna, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/111,225

(22) Filed: Jul. 7, 1998

(51) Int. Cl.[7] .................................................. H03G 3/20
(52) U.S. Cl. ........................ 381/57; 381/104; 381/107; 381/111; 381/92; 348/734
(58) Field of Search .......................... 381/57, 104, 107, 381/105, 108, 106, 109, 56, 315, 94.1, 92, 111–115; 348/738, 734

(56) References Cited

U.S. PATENT DOCUMENTS

| | | | |
|---|---|---|---|
| 4,672,674 A | * 6/1987 | Clough et al. ................. 381/94 |
| 5,303,306 A | * 4/1994 | Brillhart et al. ............. 381/315 |
| 5,606,443 A | * 2/1997 | Sgambati ..................... 359/143 |
| 5,640,450 A | * 6/1997 | Watanabe ...................... 381/57 |
| 5,664,303 A | * 9/1997 | Johnson .................... 24/585.12 |
| 5,666,426 A | 9/1997 | Helms .......................... 381/57 |
| 5,737,433 A | * 4/1998 | Gardner ...................... 381/94.1 |
| 5,778,077 A | * 7/1998 | Davidson ...................... 381/57 |
| 5,910,996 A | * 6/1999 | Eggers et al. ............... 381/107 |
| 6,005,953 A | * 12/1999 | Stuhlfelner ................. 381/107 |
| 6,069,567 A | * 5/2000 | Zawilski ................ 340/825.22 |
| 6,078,670 A | * 6/2000 | Beyer ......................... 381/107 |
| 6,169,807 B1 | * 1/2001 | Sansur ........................ 381/107 |

* cited by examiner

Primary Examiner—Minsun Oh Harvey
Assistant Examiner—Laura A. Grier

(57) ABSTRACT

An automatic remote control device and method which compensates for ambient, environmental noise changes and sudden changes in program material volume. The microphones and circuitry associated with the volume control apparatus are located in an autonomous, preferably portable, remote control unit that will work with any existing audio/video device that is configured to respond to a remote control input. In one embodiment, the remote control device comprises a microprocessor, at least one directional microphone for receiving a sound level emitted from a sound-emitting device, and at least one omni-directional microphone for receiving the total noise level in the vicinity of the remote control device. The microprocessor located in the remote control device utilizes the received sound level and the total received noise level to calculate a reference sound-to-noise ratio. If a volume up/down control is pressed by the operator, the remote control device sends the appropriate signal to the sound-emitting device to increase or decrease the sound level, and a new reference sound-to-noise ratio is calculated. If the volume up/down control has not been used, a timed polling loop periodically measures the sound level and the total received noise level so as to calculate a current sound-to-noise ratio and to determine whether the sound-to-noise ratio has changed. If the sound-to-noise ratio has changed, then the remote control device sends the appropriate signal to the sound-emitting device to adjust the sound level so that the original sound-to-noise ratio is maintained. Hysteresis, in which the device determines whether a predetermined amount of time has passed since the device last adjusted the sound level, is preferably utilized to prevent continuous fluctuations of the sound.

13 Claims, 2 Drawing Sheets

REMOTE AUTOMATIC VOLUME CONTROL APPARATUS

FIELD OF THE INVENTION

The present invention relates generally to audio and video technology, and more particularly to automatic volume control.

BACKGROUND OF THE INVENTION

Automatic volume control technology is gaining popularity for use with various types of electronic equipment, when there is a desire to adjust the volume of sound-emitting equipment, i.e.—televisions and audio equipment, based on the noise levels which exists in the immediate surrounding area. An example of this technology can be seen in U.S. Pat. No. 5,666,426 entitled "Automatic Volume Control to Compensate for Ambient Noise Variations". The '426 patent describes an apparatus and method wherein a processing circuitry comprises a microphone for monitoring the ambient noise, an analog-to-digital ("A/D") converter connected to the output of the microphone, and a digital signal processor connected to the output of the A/D converter. Utilizing this equipment, the processing circuitry calculates the ratio of the equipment's sound level to the noise level of the ambient environment, polls the room periodically to obtain subsequent ratios, and adjusts the sound level of the equipment depending on whether there has been a change in the ratio.

One disadvantage of existing automatic volume control technology is that a sound-emitting device, not equipped with automatic volume control technology, must be physically modified in order to gain automatic volume control capability. In other words, the automatic volume control equipment must be imbedded in each and every sound-emitting device. Physically modifying each existing device to add automatic volume control capability, in addition to being costly, creates a risk that the existing devices will be damaged. In addition, the manufacturer's warranties on the sound-emitting device can be voided, since many of the warranties prohibit modification of the device. Thus, owners of existing sound-emitting devices could be discouraged from adding automatic volume controls to their devices.

Another disadvantage of the existing automatic volume control technology is that, by being imbedded in the sound-emitting device, the microphones measure the noise levels near the sound-emitting device even though the person listening to the sound-emitting device is across the room. For instance, if the person using an existing sound-emitting device is watching television while a vacuum cleaner is operating across the room, the automatic volume control apparatus would be performing a noise ratio analysis based upon the noise levels in the vicinity of the television. In the vicinity of the television, the noise generated by the television is significantly greater than the noise generated by the vacuum cleaner several feet away. Thus, the ratio calculated by the automatic volume control apparatus would not accurately reflect the actual noise ratio experienced by the person listening to the device.

Therefore, there exists a need for an automatic volume control device and a method which effectively adjusts the volume of a sound-emitting device based on an ambient noise level in the vicinity of the listener.

There also exists a need for an automatic volume control device and a method which can be utilized with an existing sound-emitting device which accepts a remote signal, and which can be used to control multiple sound-emitting devices without requiring modification of each individual device.

SUMMARY OF THE INVENTION

The present invention consists of an automatic remote control device and method which compensates for ambient, environmental noise changes and sudden changes in program material volume. The microphones and circuitry associated with the volume control apparatus are located in an autonomous portable remote control unit that will work with any existing audio/video device that is configured to respond to a remote control input. The remote control device comprises a microprocessor, at least one directional microphone for receiving a sound level emitted from a sound-emitting device, and at least one omni-directional microphone for receiving the total noise level in the vicinity of the remote control device. In one embodiment of the invention, the microprocessor located in the remote control device utilizes the received sound level and the total received noise level to calculate a reference sound-to-noise ratio. If a volume up/down control is pressed by the operator, the remote control device sends the appropriate signal to the sound-emitting device to increase or decrease the sound level, and a new reference sound-to-noise ratio is calculated. If the volume up/down control has not been used, a timed polling loop periodically measures the sound level and the total received noise level so as to calculate a current sound-to-noise ratio and to determine whether the sound-to-noise ratio has changed. If the sound-to-noise ratio has changed, then the remote control device sends the appropriate signal to the sound-emitting device to adjust the sound level so that the original sound-to-noise ratio is maintained. Hysteresis, in which the device determines whether a pre-determined amount of time has passed since the device last adjusted the sound level, is preferably utilized to prevent continuous fluctuations of the sound.

BRIEF DESCRIPTION OF THE DRAWINGS

The present invention will be further understood from the following description with reference to the accompanying drawings, in which.

DETAILED DESCRIPTION OF THE INVENTION

Figure 1:
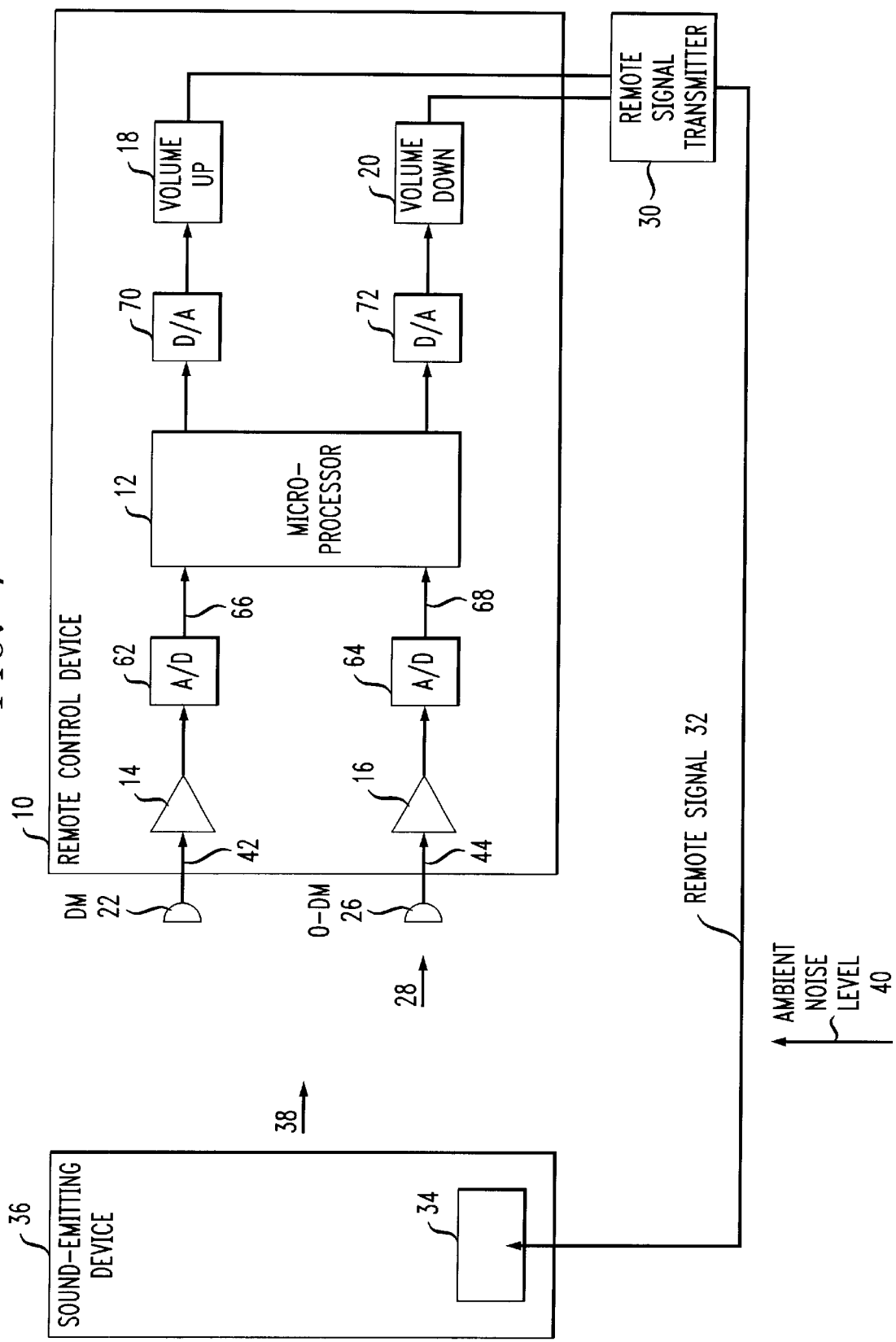
FIG. 1 shows a system for automatic volume control, in accordance with one embodiment of the invention.

The present invention is a system and method for automatically adjusting the sound level emitted from a sound-emitting device based upon changes in the ambient noise level or unintended changes in the sound level emitted by the sound-emitting device. FIG. 1 shows one embodiment of the invention. Remote control device 10 is used in the vicinity of ambient noise level 40 to adjust emitted sound level 38 from sound-emitting device 36. Ambient noise level 40 is the noise which exists in the vicinity of the person listening to sound-emitting device 36 (i.e.—the person watching television or listening to the audio equipment, etc.). This could include any noise which the person hears, such as talking in the room, the noise of an air conditioner, lawnmowers running outside the window of a room, etc. When ambient noise level 40 fluctuates, the person listening to sound-emitting device 36 may no longer find sound level 38 comfortable to listen to. Specifically, if ambient noise level 40 increases, then the person may not be able to comfortably hear emitted sound level 38. In this case, the person may desire to raise the volume of emitted sound level 38 in order to compensate for the noisy background. Conversely, if ambient noise level 40 decreases, the person may find that emitted sound level 38 is too loud. In this case, the person may desire to lower emitted sound level 38 to a more comfortable level.

Sound-emitting device 36 can be any device that emits sound, and that responds to a remote input signal as a means for adjusting the level of that sound. The most obvious devices are televisions and audio equipment, which are common in most homes. However, any device which has an adjustable volume control could potentially be utilized. In other embodiments of the invention, the sound-emitting device could be a computer, a video game station, the sound system of a restaurant or dance club, a P.A. system for use in making announcements, etc. Sound-emitting device 36 comprises remote signal receiver 34, which receives remote signal 32. Remote signal 32 is typically an instruction signal sent by remote control device 10 to increase or decrease emitted sound level 38.

Remote control device 10 is an autonomous remote control device which is preferably portable. Remote control device 10 comprises directional microphone 22. Directional microphone 22 is designed to receive sounds from a specific direction only. Thus, directional microphone 22 is advantageously configured in remote control device 10 so that it points toward sound-emitting device 36. In one embodiment of the invention, directional microphone 22 is configured in remote control device 10 such that it is adjacent to and points in the same direction as remote signal transmitter 30, thus providing the greatest likelihood that directional microphone 22 is pointing at sound-emitting device 36.

Remote control device 10 further comprises omni-directional microphone 26. Omni-directional microphone 26 is designed to receive sounds from all directions in the vicinity of remote control device 10. Thus, omni-directional microphone 26 is advantageously positioned in remote control device 10 so as to permit the most unobstructed receipt of the sound in the vicinity. In FIG. 1, omni-directional microphone 26 receives total received noise level 28. Total received noise level 28 comprises the combination of emitted sound level 38 and ambient noise level 40. Thus, total received noise level 28 represents the aggregate of all the sounds which the user would hear, from whatever source.

Remote control device 10 further comprises amplifier 14 and amplifier 16. Amplifier 14 is coupled to directional microphone 22 and is configured to amplify the signal provided by microphone 22. Likewise, amplifier 16 is coupled to omni-directional microphone 26, and is configured to amplify the signal provided by omni-directional microphone 26. Amplifiers 14 and 16 amplify the directional signal 42 and omni-directional signal 44, respectively, and send them to microprocessor 12 via A/D converters, 62 and 64 respectively.

In one embodiment of the invention, remote control device 10 includes a micro-processor 12, although the invention is not limited in scope in that respect. For example, other processing circuits may be employed to control the operation of the remote control device. Microprocessor 12 receives digital directional signal 66 and digital omni-directional signal 68 and in one embodiment of the invention, performs calculations to establish a reference sound-to-noise ratio. The reference sound-to-noise ratio represents the comfortable volume level for the user to listen to sound-emitting device 36 at a given ambient noise level 40. The sound-to-noise ratio is the quotient of digital directional signal 66 and the difference between digital omni-directional signal 68 and digital directional signal 66. Microprocessor 12, with a timed polling loop, periodically calculates the sound-to-noise ratio. If the sound-to-noise ratio has changed since the last time the sound-to-noise ratio was calculated, then either emitted sound level 38 has changed without an equivalent change in ambient noise level 40 (e.g.—a commercial advertisement comes on which is louder than the program originally being listened to), or ambient noise level 40 has changed without an equivalent change in emitted sound level 38. In either case, microprocessor 12 facilitates a change in emitted sound level 38 in order to return to the original sound-to-noise ratio. The use of a reference sound-to-noise ratio is discussed in more detail, in reference with the flowchart illustrated in FIG. 2.

Remote control device 10 further comprises volume-up control 18 and volume-down control 20. In accordance with one embodiment of the invention, volume up and down control units 18 and 20 employ a voltage controlled oscillator which generates a corresponding signal indicative of a desired volume level. It is also noted that the structure and operation of volume up and down control units 18 and 20 depend on the specifications that govern the operation of sound emitting device 36. For example, these control units, in accordance with another embodiment of the invention, generate specific signal codes that can be interpreted as volume instructions by sound emitting device 36.

Microprocessor 12 communicates with volume-up control 18 and volume-down control 20, via digital-to-analog converters 70 and 72, respectively. During operation, once microprocessor 12's calculations determine that emitted sound level 38 needs to be adjusted, the appropriate signals provided by volume up/down controls 18 and 20 are sent to sound-emitting device 36 via remote signal transmitter 30.

Volume-up control 18 and volume-down control 20 also respond to a user interface volume control button (not shown) disposed on an external surface of remote control device 10. By pressing these interface buttons a user may remotely adjust the volume of sound-emitting device 36. Microprocessor 12 is configured to monitor such user adjustments. Specifically, volume-up control 18 and volume-down control 20 communicate with microprocessor 12 so that, if the user presses a volume control button, microprocessor 12 can account in its calculations for the user's preference for a new emitted sound level 38.

Remote control device 10 further comprises signal transmitter 30, which communicates with volume-up control 18 and volume-down control 20. A remote signal 32 is transmitted by signal transmitter 30 and received by signal receiver 34. As discussed previously, sound emitting device 36 is comprised of signal receiver 34, and depending on the signal received, sound emitting device 36 will increase or decrease emitted sound level 38.

Figure 2:
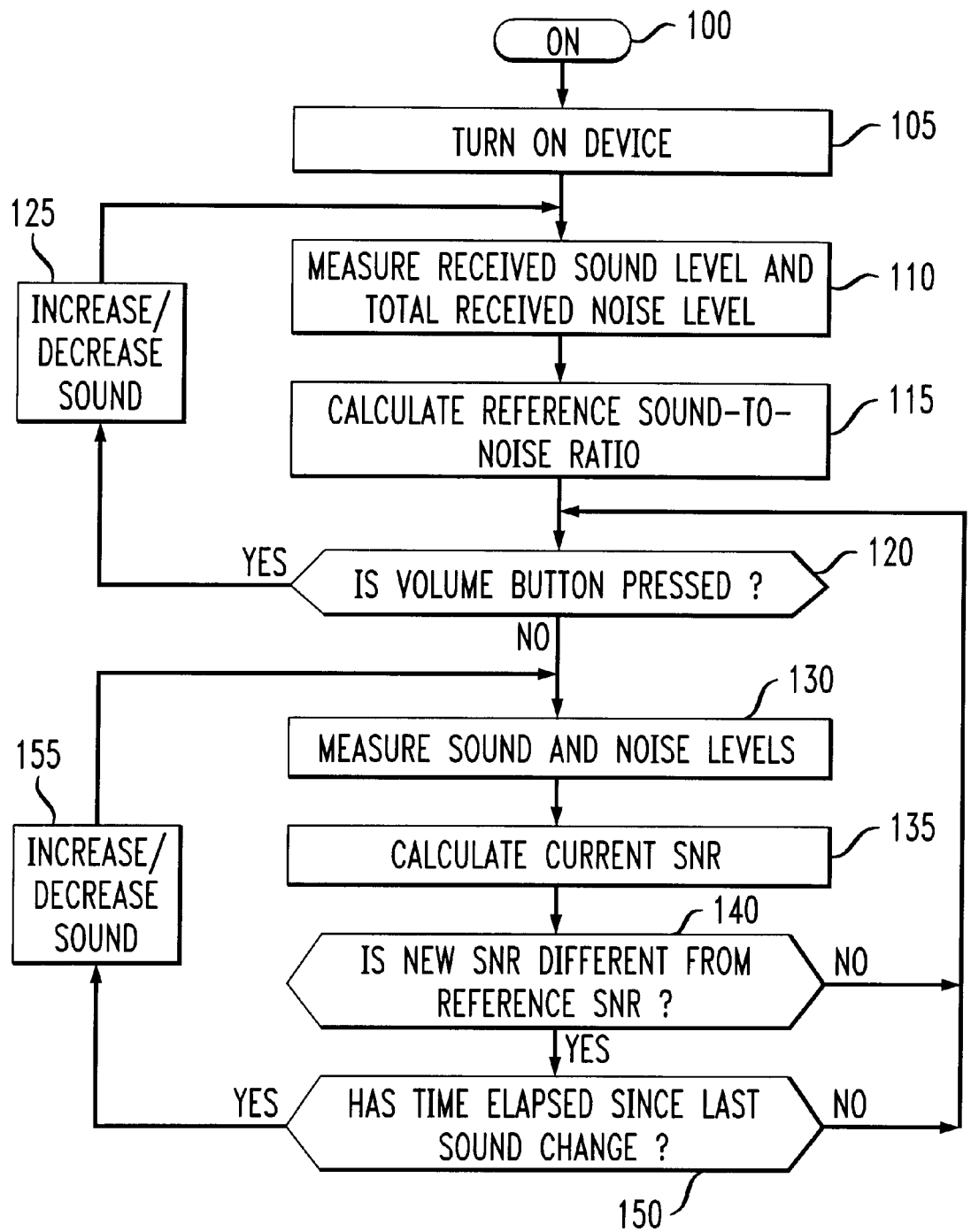
FIG. 2 is a flowchart showing a method for automatically adjusting a sound level, in accordance with one embodiment of the invention.

FIG. 2 shows a flow chart describing one embodiment of the invention. Specifically, FIG. 2 shows the steps performed in order to automatically adjust emitted sound level 38 of sound-emitting device 36 by using a sound-to-noise ratio calculation. At step 100 remote control device 10 is activated. At step 105, sound-emitting device 36 is turned on. Step 105 can be accomplished by any means, but the likeliest way is to press a "device on"-type button on remote control device 10.

At step 110, received sound level 24 and total received noise level 28 are determined. As described and shown in FIG. 1, received sound level 24 is received by directional microphone 22, which forwards received sound level 24 through amplifier 14 and analog-to-digital converter 62 until it arrives as digital directional signal 66 at microprocessor 12. Similarly described and shown in FIG. 1, total received noise level 28 is received by omni-directional microphone 26, which forwards total received noise level 28 through amplifier 16 and analog-to-digital converter 48 until it arrives as digital omni-directional signal 68 at microprocessor 12.

At step 115, microprocessor 12 calculates a reference sound-to-noise ratio. As discussed previously, the sound-to-noise ratio is a ratio in which received sound level 24 is the numerator and the difference between total received noise level 28 and received sound level 24 is the denominator. As is evident, the difference between total received noise level 28 and received sound level 24 is equivalent to ambient noise level 40.

At step 120, microprocessor 12 determines whether the user has pressed a volume control button. If so, it is assumed that the reference sound-to-noise ratio was unsatisfactory to the user.

If either of the buttons has been pressed, microprocessor 12 goes to step 125 to signify either an increase or decrease in emitted sound level 18. Microprocessor 12 then returns to step 110 to re-measure received sound level 24 and total received noise level 28 before proceeding to step 115 to re-calculate a new reference sound-to-noise ratio.

If the user has not pressed a volume control button, microprocessor 12 proceeds to step 130. At step 130, microprocessor 12, according to a timed polling loop, re-measures received sound level 24 and total received noise level 28. The timed polling loop would permit the re-measurement of received sound level 24 and total received noise level 28 at any desirable periodic interval, so as to prevent volume adjustments within a specified interval since a previous volume adjustment. At step 135, microprocessor 12 calculates the current sound-to-noise ratio. This sound-to-noise ratio is calculated in the same fashion as step 115, in which received sound level 24 is divided by the difference between total received noise level 28 and received sound level 24.

Microprocessor 12 then goes to decision step 140 to determine whether the current sound-to-noise ratio calculated in step 135 is different from the reference sound-to-noise ratio calculated in step 115. If there is no difference between the current sound-to-noise ratio and the reference sound-to-noise ratio, microprocessor 12 returns to step 120. If there is a difference between the two sound-to-noise ratios, this signifies that emitted sound level 38 may need to be adjusted in order to maintain the original sound-to-noise ratio established by the user. As previously discussed, if the sound-to-noise ratio has changed since the last time the sound-to-noise ratio was calculated, then either emitted sound level 38 has changed without an equivalent change in ambient noise level 40 (e.g.—a commercial advertisement comes on which is louder than the program originally being listened to), or ambient noise level 40 has changed without an equivalent change in emitted sound level 38.

If the sound-to-noise ratio has changed, microprocessor 12 goes to step 150 to determine whether a given amount of time has elapsed since the last time emitted sound level 38 was changed by remote control device 10. In effect, step 150 provides a hysteresis loop, and is included to prevent continual fluctuations in emitted sound level 38. For example, in one embodiment of the invention, remote control device 10 polls for changes in the sound-to-noise ratio once every second. However, it may not be desirable to adjust emitted sound level 38 every second, even if the sound-to-noise ratio was changing often enough so as to ordinarily compel it, since a person listening to device 10 may find the continual fluctuations of emitted sound level 38 annoying or distracting. The hysteresis feature of remote control device 10 could be utilized to prevent adjustments being made to emitted sound level 38 every second. Device 10 could be configured so that no adjustments to emitted sound level 38 would occur unless, for example, five seconds has elapsed since the last adjustment to emitted sound level 38 was made. If step 150 determines that sufficient time has elapsed since the last time emitted sound level 38 was adjusted, then emitted sound level 38 is increased or decreased in order to maintain the original sound-to-noise ratio.

Regarding the embodiment of the invention which is shown in the flowchart of FIG. 2, additional or alternative steps can be performed to achieve different results. For instance, in another embodiment of the invention, emitted sound level 38 will not be increased or decreased if emitted sound level 38 is already at a predetermined maximum or minimum threshold level. This embodiment would be advantageously used in order to prevent the continued increase or decrease of emitted sound level 38 to a level which is uncomfortable or undesirable to the user, even though microprocessor 12 would ordinarily determine that ambient noise level 40 justifies said increase or decrease.

In other embodiments of the invention, other threshold levels are utilized. For instance, it may be advantageous that only substantial increases or decreases in ambient noise level 40 result in a corresponding change to emitted sound level 38. In this case, the flowchart in FIG. 2 is modified such that step 150 is replaced by a decision step to determine whether the current sound-to-noise ratio has changed by a predetermined amount, e.g.—1/10. If it has changed by at least the predetermined amount, then emitted sound level 38 is increased or decreased as usual. If not, then emitted sound level 38 is not increased or decreased as usual and the method returns to step 130. Similarly, the thresholds could be set depending on numerous different criteria, i.e.— whether emitted sound level 38 is greater or less than a threshold amount, whether the difference between a sound-to-noise ratio and the current sound-to-noise ratio is greater or less than a specified amount, whether total received noise level 28 is greater or less than a threshold amount, etc.

In another embodiment of the invention, the present invention is used to increase or decrease emitted sound level 38 in an inverse relation with ambient noise level 40. For instance, it may be advantageous for a person who receives a telephone call to turn down the volume of the television while using the telephone. The talking into the telephone would add to ambient noise level 40 and consequently to total received noise level 28. In the embodiments previously explained, microprocessor 12 would increase emitted sound level 38 to compensate for the sound of the talking by sending the appropriate signal to be received by remote volume-up up button 18. However, in this embodiment, microprocessor 12 would decrease emitted sound level 28 to allow the user of the telephone to concentrate on the telephone conversation. Microprocessor 12 would decrease emitted sound level 38 by sending the appropriate signal to be received by remote volume-down button 20.

In another embodiment of the invention, the remote control device has a selector switch which enables it to operate on multiple sound-emitting devices with remote control capability. In this embodiment, the remote control device is "universal" or programmable, enabling the user to selectively control each individual sound-emitting device by operating the selector switch of the remote control device. In addition, the selector switch may also render the user capable of controlling all of the sound-emitting devices simultaneously. Thus, the need for modification of multiple sound-emitting devices is eliminated with a single remote control device which is user-selectable.

While there has been shown and described particular embodiments of the invention, it will be obvious to those skilled in the art that changes and modifications can be made therein without departing from the invention, and therefore, the appended claims shall be understood to cover all such changes and modifications as fall within the true spirit and scope of the invention.

We claim:

1. A system for automatically adjusting a sound level, comprising:

a sound-emitting device providing a sound level and a receiver configured to respond to a remote control volume signal to control said sound level; and a remote control device operable by a user to manually increase or decrease the sound level of said sound-emitting device, said remote control device further comprising;

at least one directional microphone for sensing said sound level;

at least one omni-directional microphone for sensing a total received noise level equal to said sound level plus an ambient noise level;

processing circuitry, coupled to said directional and said omni-directional microphones, for measuring sound level to noise ratio levels, as sensed by said two microphones for determining whether said sound level emitted by said sound-emitting device should be increased or decreased or remain unchanged;

a plurality of volume control units, coupled to said processing circuitry and configured to generate said remote control volume signal; and a remote signal transmitter coupled to said volume control units, said remote signal transmitter for transmitting said remote control volume signal to said sound-emitting device based on said measurement of sound level to noise ratio level.

2. The system of claim 1, wherein said remote control device further comprises processing circuitry for calculating a sound-to-noise ratio equal to said sound level divided by said ambient noise level.

3. The system of claim 1, wherein said processing circuitry further comprises a timed polling loop for calculating a plurality of sound-to-noise ratios equal to said sound level divided by said ambient noise level, within a predetermined time period.

4. The system of claim 1, wherein said at least one directional microphone is configured in said remote control device such that said at least one directional microphone is adjacent to and points in the same direction as said remote signal transmitter.

5. The system of claim 1, wherein said remote control device further comprises a plurality of amplifiers for amplifying said sound level and said total received noise level.

6. The system of claim 1, further comprising a plurality of sound-emitting devices, and wherein said remote control device further comprises a user-selectable switch for adjusting said sound level of a selected sound-emitting device.

7. A method of automatically adjusting a sound level of a sound-emitting device, said method comprising the steps of:

(a) measuring a sound level emitted from said sound-emitting device using a directional microphone housed in a remote control device operable by a user to manually increase or decrease said sound level;

(b) measuring a total received noise level using an omni-directional microphone housed in said remote control device;

(c) using processing circuitry having a timed polling loop housed in said remote control device for measuring sound to noise ratio levels, as sensed by said two microphones for determining whether said sound level emitted by said sound-emitting device should be increased or decreased or remain unchanged; and (d) transmitting a remote signal to said sound-emitting device to instruct said sound-emitting device to adjust said sound level based on said measurement of sound level to noise ratio level.

8. The method of claim 7, wherein said determining step further comprises:

(a) calculating a reference sound-to-noise ratio equal to said sound level divided by said difference between said total received noise level and said sound level;

(b) measuring said sound level;

(c) measuring said total received noise level;

(d) calculating a current sound-to-noise ratio equal to said measured sound level divided by the difference between said measured total received noise level and said measured sound level;

(e) adjusting said new level when said current sound-to-noise ratio does not equal said reference sound-to-noise ratio.

9. The method of claim 8, wherein said change in said sound-to-noise ratios is caused by a change in said sound level emitted from said sound-emitting device.

10. The method of claim 7, wherein said adjusting step further comprises:

(a) calculating a reference sound-to-noise ratio equal to said sound level divided by said the difference between said total received noise level and said sound level;

(b) determining whether any of a plurality of volume control buttons was pressed;

(c) adjusting said sound level according to which of said plurality of volume control buttons was pressed;

(d) calculating said reference sound-to-noise ratio;

(e) measuring said sound level;

(f) measuring said total received noise level;

(g) calculating a current sound-to-noise ratio equal to said measured sound level divided by the difference between said re-measured total received noise level and said re-measured sound level;

(h) adjusting said sound level when said current sound-to-noise ratio does not equal said reference sound-to-noise ratio.

11. The method of claim 7, wherein the step of adjusting further comprises ascertaining whether a minimum amount of time has elapsed since said sound level was last adjusted.

12. The method of claim 7, wherein the step of adjusting further comprises ascertaining whether said sound level is below a predetermined maximum sound level.

13. The method of claim 7, wherein the step of adjusting further comprises ascertaining whether said total received noise level is below a predetermined maximum received noise level.

* * * * *